United States Patent [19]
Kurakake et al.

[11] Patent Number: 5,200,968
[45] Date of Patent: Apr. 6, 1993

[54] LASER AMPLIFIER FOR AMPLIFYING OPTICAL WAVES WITHOUT SATURATION

[75] Inventors: Hirohide Kurakake; Haruhiko Tabuchi, both of Kawasaki, Japan

[73] Assignee: Fujitsu Limited, Kawasaki, Japan

[21] Appl. No.: 809,114

[22] Filed: Dec. 18, 1991

[30] Foreign Application Priority Data

Dec. 18, 1990 [JP] Japan .................... 2-403384

[51] Int. Cl.$^5$ .............................. H01S 3/19
[52] U.S. Cl. ........................ 372/46; 372/43; 372/49; 372/50; 359/344
[58] Field of Search .............. 372/39, 43, 45, 46, 372/47, 48, 49, 50, 96, 102; 359/333, 344, 345, 346

[56] References Cited
U.S. PATENT DOCUMENTS

| | | | |
|---|---|---|---|
| 4,744,089 | 5/1988 | Montroll et al. | 372/50 |
| 4,856,017 | 8/1989 | Ungar | 372/96 |
| 4,914,667 | 4/1990 | Blonder et al. | 372/50 X |
| 4,941,146 | 7/1990 | Kobayashi | 372/45 |
| 4,942,585 | 7/1990 | Ungar | 372/44 |
| 5,020,153 | 5/1991 | Choa et al. | 372/96 X |
| 5,103,455 | 4/1992 | Eichen et al. | 372/50 |
| 5,132,978 | 7/1992 | Marshall | 372/105 X |

FOREIGN PATENT DOCUMENTS 1-268084 10/1989 Japan .................... 372/46 X

Primary Examiner—Brian Healy
Attorney, Agent, or Firm—Staas & Halsey

[57] ABSTRACT

A laser amplifier comprises an active layer having a uniform width and a thickness and causing a stimulated emission of photons upon passage of an incident optical beam from an input end to an output end, an optical wave guide layer extending from the input end to the output end for guiding an optical beam therethrough, a first clad layer provided below the waveguide layer, a second clad layer provided above the active layer, a first electrode provided on the second clad layer, a second electrode provided on the first clad layer, a first anti-reflection coating provided on the input end, and a second anti-reflection coating provided on the output end.

12 Claims, 8 Drawing Sheets

LASER AMPLIFIER FOR AMPLIFYING OPTICAL WAVES WITHOUT SATURATION

BACKGROUND OF THE INVENTION

The present invention generally relates to semiconductor devices and more particularly to a laser amplifier supplied with a traveling optical beam and for amplifying the same by the stimulated emission.

In the long range optical telecommunication systems, it is necessary to provide optical repeaters in the optical fiber network for compensating the optical loss. Typically, the laser amplifiers are used for such optical repeaters. BY using the laser amplifiers, it is possible to amplify the optical signals on the optical fiber network without converting the same once to an electrical signal and further converting the electrical signal to the optical signal. Thereby, the construction of the optical telecommunication network is significantly simplified.

Figure 1:
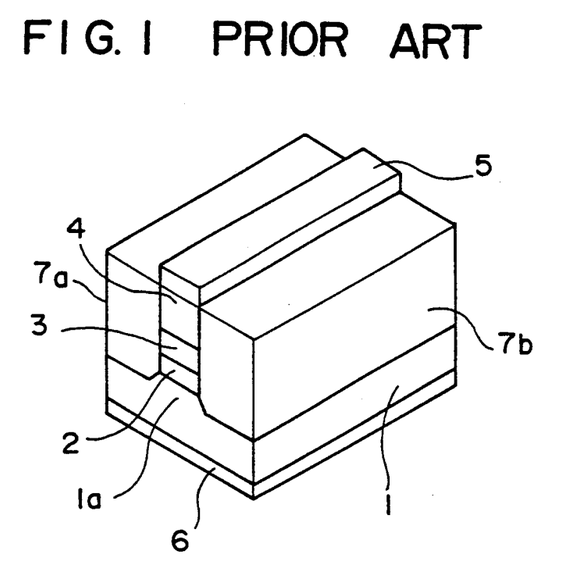
FIG.1 is a diagram showing a conventional laser amplifier in the perspective view.

FIG.1 shows the construction of a typical conventional laser amplifier used for the optical repeaters.

Referring to FIG.1, the laser amplifier is formed on an n-type substrate 1 of InP. As illustrated, the substrate 1 is formed with a mesa structure 1a that extends like a stripe in the longitudinal direction.

On the upper major surface of the mesa 1a, there is provided an n-type waveguide layer 2 of In-GaAsP, and an undoped active layer 3 of InGaAsP is provided further on the layer 2. Further, a p-type clad layer 4 of InP is provided on the active layer 3. On the upper major surface of the clad layer 4, an upper electrode 5 is provided in ohmic contact therewith. On the lower major surface of the substrate 1, on the other hand, there is provided another ohmic electrode 6. Thereby, the waveguide layer 2, the active layer 3 and the clad layer 4 form a stripe-like region corresponding to the mesa 1a. Further, InP layers 7a and 7b are provided at both sides of the stripe-like region for confining the path of current injected from the electrode 5 and flowing to the electrode 6 through the structure of the laser diode.

The device of FIG.1 lacks the usual reflectors at both longitudinal ends. Thereby, the laser oscillation does not occur even when the electrodes 5 and 6 are biased to the extent that the laser diode oscillates when there are such reflectors. Upon incidence of an optical beam, the stimulated emission occurs in the device in response to the passage of the wavefront of the optical beam and the optical beam is amplified as is travels from one end to the other end of the device.

In such an operation of the optical amplification, it will be noted that a large gain is achieved by increasing the optical confinement factor $\Gamma$ such that the optical beam is effectively confined in the active layer 3 as it travels through the device. On the other hand, when the optical confinement factor $\Gamma$ is excessive, there is a tendency that the active layer 3 is saturated by the photons in the region close to the output end. When saturated, no or reduced stimulated emission occurs even when the optical beam passes through the active layer 3. Thereby, the gain of the optical amplification is saturated at the region close to the output end of the laser amplifier.

Figure 2A:
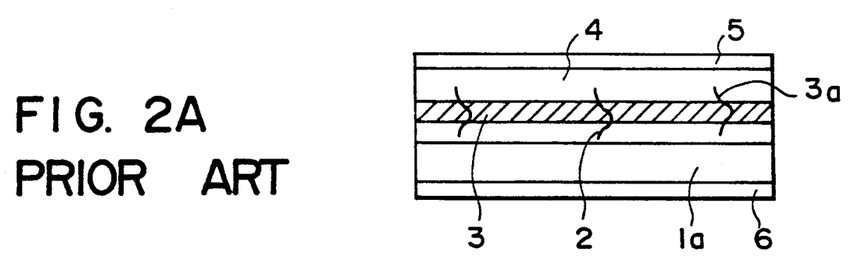
FIGS.2(A)–2(D) are diagrams showing the cross section of the laser amplifier of FIG.1 together with the optical amplification for a case wherein the optical confinement is strong and wherein the optical confinement is weak.
Figure 2B:
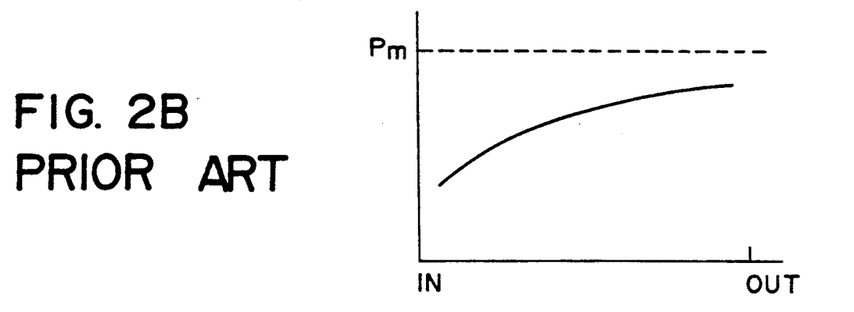

FIGS.2(A) and 2(B) are diagrams showing the saturation of optical amplification, wherein FIG.2(A) shows the vertical cross section of the diode of FIG.1 taken along the longitudinal direction while FIG.2(B) shows the optical intensity profile in the active layer 3. In FIG.2(A), the curve designated as 3a represents the optical intensity profile taken along the vertical cross section that is perpendicular to the traveling direction of the optical beam. It will be seen that there is a strong concentration of optical intensity in the active layer 3.

In this conventional example, it will be noted that the intensity of the optical beam increases with the traveling of the optical beam at the region close to the input end while the increase in the intensity becomes gentle and approaches to a level Pm at the output end. Once reached to the level Pm, the optical intensity and hence the optical output of the laser amplifier does not increase even when the longitudinal length is increased further.

Figure 2C:
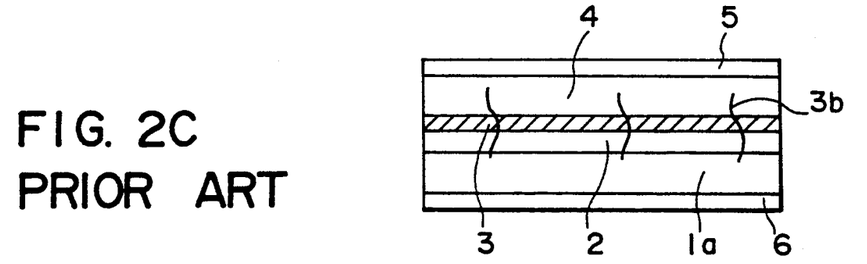
Figure 2D:
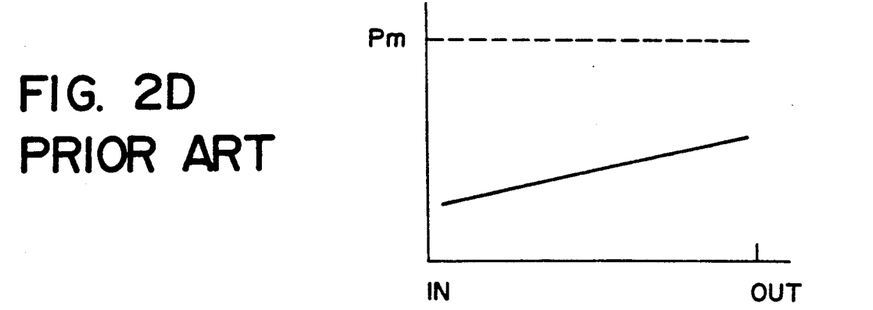

FIGS.2(C) and 2(D) are diagrams corresponding to FIGS.2(A) and 2(B) for showing the optical amplification in a laser amplifier wherein the optical confinement factor $\Gamma$ is reduced. As shown in FIG.2(C) by a curve 3b, the optical intensity distribution in the vertical cross section of the laser amplifier is more diffused as compared with the structure of FIG.2(A). In the illustrated example, such a reduction in the optical confinement factor $\Gamma$ is achieved by reducing the thickness of the active layer 3 with respect to the waveguide layer 2.

In this example, the optical intensity in the active layer 3 increases generally linearly with the propagation of the optical beam from the input end to the output end. However, due to the reduced optical confinement in the active layer, the magnitude of the optical intensity in the active layer 3 is substantially smaller than the device of FIG.2(A).

In order to avoid the optical saturation and to obtain the linearly increasing optical power, Japanese Laid-open Patent Application 1-268084 proposes a structure wherein the lateral width of the active layer increases generally linearly from the input end to the output end. By constructing the active layer as such, the photon density in the active layer is maintained substantially constant at both the input end and the output end.

This conventional laser amplifier suffers from the problem that the quality of crystal forming the active layer tends to be degraded. More specifically, due to the existence of the side walls extending mutually with an angle, there is a tendency that defects such as dislocations tend to be formed in the active layer and such defects act as the recombination center for annihilating the carriers irrespective of the passage of the optical wavefront. Thereby, the efficiency of optical amplification and hence the optical gain of the laser diode is inevitably decreased.

SUMMARY OF THE INVENTION

Accordingly, it is a general object of the present invention to provide a novel and useful laser amplifier for amplifying a traveling optical beam, wherein the foregoing problems are eliminated.

Another and more specific object of the present invention is to provide a laser amplifier having an active layer extending from an input end to an output end for amplifying an optical beam incident to the input end and traveling to the output end, wherein the saturation of the optical amplification occurring in the laser amplifier is effectively eliminated.

Another object of the present invention is to provide a laser amplifier comprising an active layer having a predetermined thickness and a predetermined width and extending from an input end to an output end for causing a stimulated emission upon passage of the wavefront of an optical beam, and an optical confinement layer provided above or below the active layer for confining the optical beam in the active layer, wherein the optical confinement layer has a thickness that is changed at a part close to the input end and at a part close to the output end such that the optical confinement is smaller at the output end than at the input end. According to the present invention, one can eliminate the problem of optical saturation at the output end of the laser amplifier as a result of the reduced optical confinement. Thereby, the problem of saturation of the optical amplification is eliminated. In the present invention, the width or thickness of the active layer is constant. Thereby, the active layer can be formed by a simple process and the formation of defects that act as the recombination center is minimized.

Other objects and further features of the present invention will become apparent from the following detailed description when read in conjunction with the attached drawings.

DETAILED DESCRIPTION OF PREFERRED EMBODIMENTS

Figure 3:
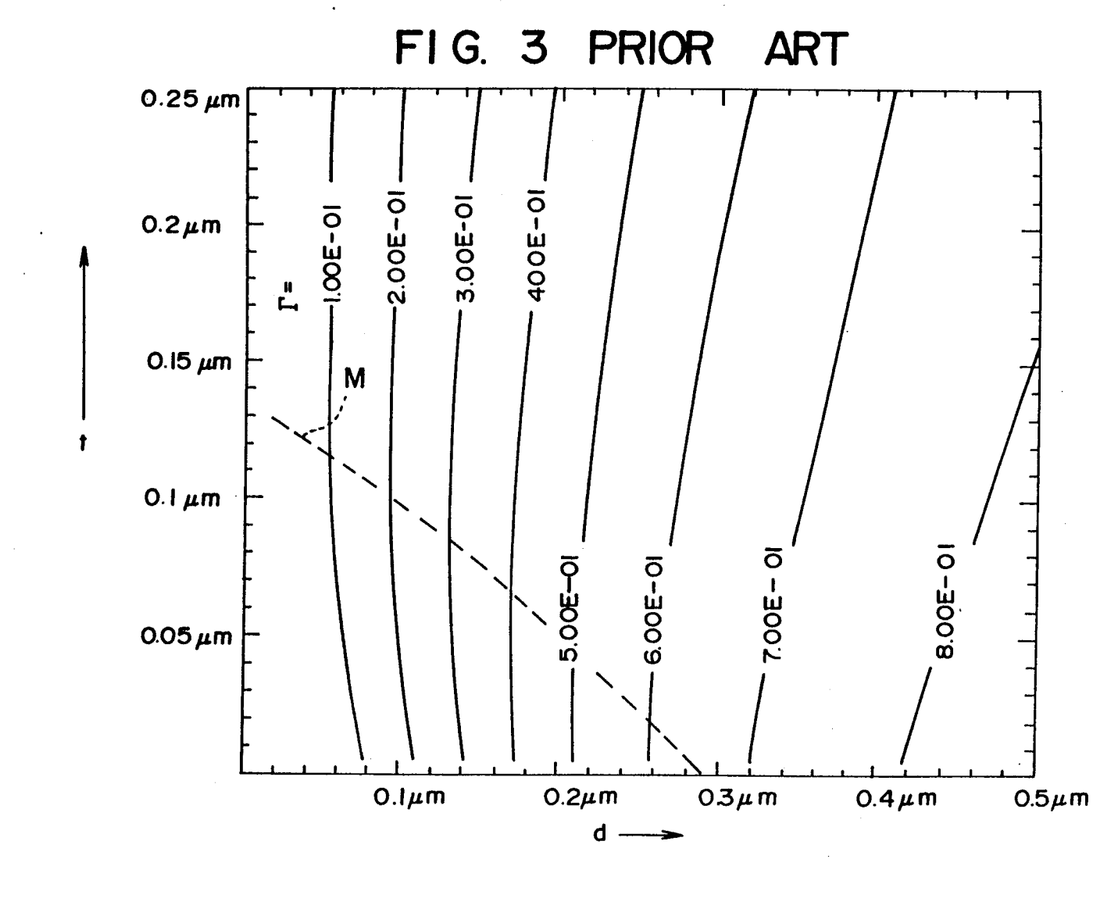
FIG.3 is a diagram showing the relationship between the thickness of the active layer and the thickness of the waveguide layer used for confining the optical beam in the active layer, for various values of the optical confinement factor.

FIG.3 shows the optical confinement factor $\Gamma$ for various combination of the thickness d of the active layer 3 and the thickness t of the waveguide layer 2. Of course, the waveguide layer 2 and the active layer 3 are sandwiched vertically by the clad layer 4 and the substrate 1 that also acts as a clad. The relationship of FIG.3 is obtained by solving the Maxwell's equation for suitable boundary conditions. The derivation of the relationship of FIG.3 can be found in the standard textbook such as HETEROSTRUCTURE LASERS, H.C. Lasey and M.B. Panish, Academic Press, Inc. The optical confinement factor $\Gamma$ is defined as the optical intensity in the active layer 3 divided by the optical intensity in all the layers, i.e. layers 1, 2, 3 and 4.

Referring to FIG.3, it will be noted that the optical confinement factor $\Gamma$ increases with increasing thickness t for a given thickness d and then decreases with further increase of the thickness t, wherein there is a maximum $\Gamma$ in correspondence to the line designated as M. In other words, the line M represents the combination of the thickness t and the thickness d that provides the maximum of the optical confinement factor $\Gamma$. The present invention employs the relationship of FIG. 3 for controlling the optical confinement factor $\Gamma$ in the laser amplifier and achieves the elimination of the unwanted saturation of optical amplification.

More specifically, for a given thickness $d_0$ of the active layer 3, the thickness of the waveguide layer 2 at the input end is set at $t_0$ in correspondence to the point on the drawing that is located on the line M. Thereby, a maximum optical confinement is achieved at the input end of the laser amplifier. On the other hand, at the region close to the output end, the thickness of the layer 2 is set at $t_1$ that is substantially larger than $t_0$. In correspondence to this, the optical confinement factor $\Gamma$ for this region is substantially reduced. Because of the reduced optical confinement at the output end of the laser amplifier, the problem of excessive concentration of photons in the output region of the active layer 3 is avoided and the optical amplification of the incident optical beam continues throughout the entire length of the laser amplifier. Alternatively, one may set the thickness of the waveguide layer 2 to a thickness $t_1'$ that is substantially smaller than the thickness $t_0$. In this case, too, one can decrease the optical confinement factor $\Gamma$ at the output end of the laser amplifier.

Figure 4A:
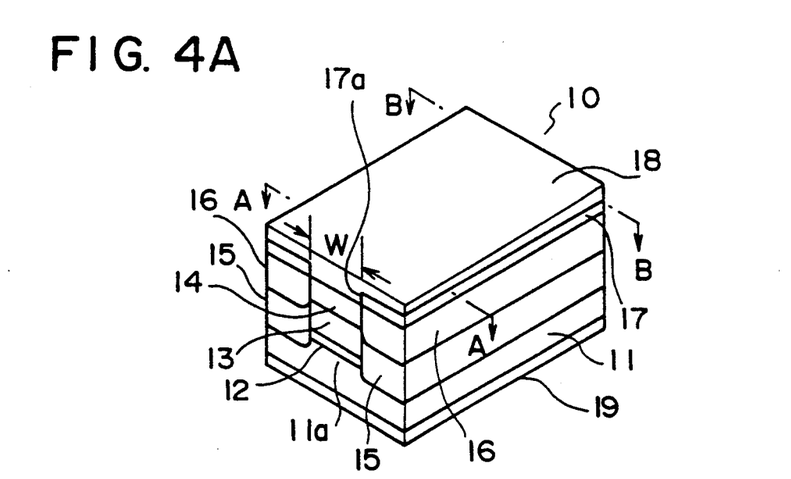
FIGS.4(A)–4(D) are diagrams showing the structure of the laser amplifier according to a first embodiment of the present invention.

FIG.4(A) shows a laser amplifier 10 according to a first embodiment of the present invention in the perspective view. In this perspective view, the laser amplifier of the present invention has a structure very similar to the structure shown in FIG.1.

Referring to FIG.4(A), the laser amplifier is constructed on an InP substrate 11 doped to the n-type with a carrier concentration level of $5 \times 10^{18} \text{cm}^{-3}$. As illustrated, there is formed a mesa region 11a that extends in th longitudinal direction of the laser diode similar to the mesa region 1a of the conventional device. Thereby, there is formed a stripe-like upper major surface that extends in the longitudinal direction of the device in correspondence to the mesa 11a. On the upper major surface of the mesa 11a, various layers to be described are deposited to form a stripelike region. The stripe-like region thus formed typically has a lateral width W of about 1 $\mu$m in correspondence to the lateral width of the mesa 11a.

Figure 4B:
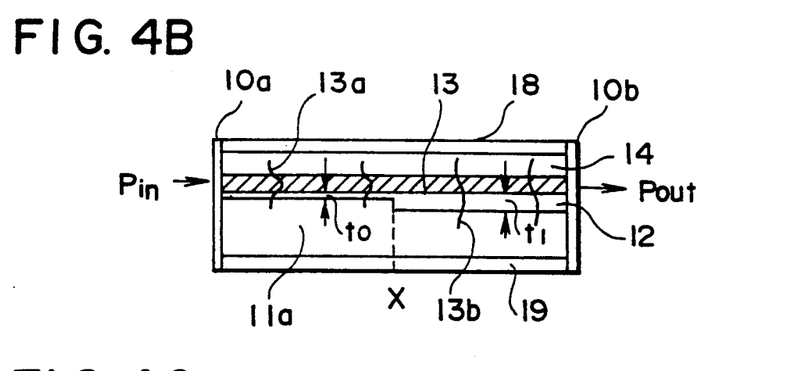

On the upper major surface of the mesa 11a, there is provided a waveguide layer 12 of n-type InGaAsP with a thickness of about 0.2 $\mu$m at the input end. As will be described later and as illustrated in FIG.4(B) that shows the vertical cross section of FIG.4(A) taken along the mesa 11a, the thickness of the layer 12 is increased at the output end. In order to increase the thickness of the layer 13 at the output end, the level of the upper major surface of the mesa region 11a is reduced at the output end in correspondence to the increase of the thickness of the layer 12. In correspondence to this, the upper major surface of the waveguide layer 12 is formed substantially flat. Typically the waveguide layer 12 has a composition corresponding to the wavelength of 1550 nm.

On the flat upper major surface of the waveguide layer 12, there is provided an active layer 13 of undoped InGaAsP with the composition corresponding to the wavelength of 1350 nm. The active layer 13 is formed with a uniform thickness of about 0.15–0.60 μm and has a uniform width corresponding to the width W of the stripe-like region. On the upper major surface of the active layer 13, a clad layer 14 of n-type InP is provided.

Further, a p-type InP layer 15 is provided on the substrate 11 at both sides of the mesa 11a up to the level between the upper and lower major surfaces of the active layer 13 for current confinement, and an n-type InP layer 16 is provided on the layer 15 also for current confinement such that the upper major surface of the layer 16 coincides with the upper major surface of the clad layer 14. On the upper major surface of the layer 16, there is provided a silicon oxide layer 17 that has an opening 17a corresponding to the stripelike region for exposing the upper major surface of the clad layer 16. Further, an upper electrode 18 is provided on the silicon oxide layer in ohmic contact with the upper major surface of the clad layer 14 via in ohmic contact with the lower major surface of the substrate 11.

Figure 4C:
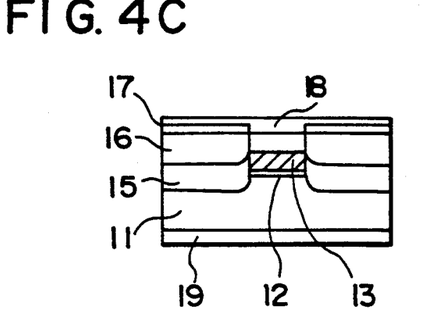
Figure 4D:
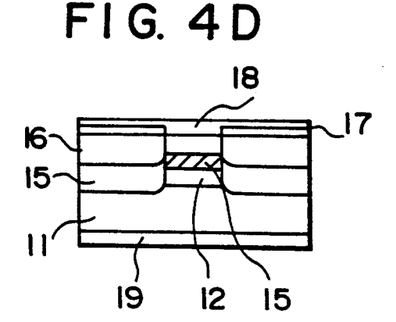

FIG.4(C) is an end view of the device of FIG.4(A) showing the end surface that can be seen in the illustration of FIG.4(A). On the other hand, FIG.4(D) is an end view similar to FIG.4(C) except that this drawing shows the end surface that is hidden in the illustration of FIG.4(A). As can be seen clearly from these illustrations, the thickness of the wave-guide layer 12 is small at the end shown in FIG.4(C) while the thickness of the layer 12 is large in the end in FIG.4(D). Referring to FIG.3, the thickness of the layer 12 in the illustration of FIG.4(C) is set to $t_0$ while the thickness of the layer 12 in the illustration of FIG.4(D) is set to $t_1$. Thus, FIG.4(C) shows the input end to which the incident optical beam enters and FIG.4(D) shows the output end from which the output optical beam exits. In the present embodiment, the thickness of the waveguide layer 12 is changed at a position X located generally at the center of the longitudinal direction as shown in the cross section of FIG.4(B). In the present embodiment, the height of the step formed in the lower major surface of the layer 12 at the point X is about 300 μm. In correspondence to this, the waveguide layer 12 has a thickness of 0.2 μm at the input end and a thickness of 0.4 μm at the output end. As already noted, the active layer 13 and the waveguide layer 13 have a uniform lateral width of 1 μm.

Further, there are provided anti-reflection coatings 10a and 10b at both ends including the both end surfaces of the active layer 13 and the waveguide layer 12 underneath for preventing the device from oscillating spontaneously. See the cross section of FIG.4(B).

In operation, a drive voltage is applied across the electrodes 18 and 19 such that the diode formed from the layers 12, 13 and 14 is biased in the forward direction. Thereby, the p-n junction at the interface between the layer 15 and the layer 16 is biased in the reverse direction and the current injected from the electrodes 18 and 19 is confined to the path passing through the stripe-like region.

In contrast to the usual laser diodes that have mirror surfaces at both ends for forming a cavity, the device of the present invention lacks such reflection means at the ends shown in FIGS.4(C) and 4(D). Instead, the device has the anti-reflection coatings 10a and 10b at both ends as shown in FIG.4(B). Thus, there occurs no spontaneous laser oscillation even when there is a drive current injected to the active layer 13 from the electrodes 18 and 19. Only when an optical beam is incident to the input end as shown in FIG.4(B) schematically as Pin, the stimulated emission of photons is triggered in response to the passage of the wavefront of the optical beam and the optical beam is amplified as it travels toward the output end.

In the present embodiment, the photon density in the active layer 13 increases continuously from the input end to the point X due to the effective confinement of the photons in the active layer 13, wherein the photon density is decreased suddenly at the point X due to the increased thickness of the waveguide layer 12 and hence the decreased optical confinement factor $\Gamma$. See FIG.3. In FIG.4(B), the optical intensity profile caused by the efficient optical confinement in the region where the thickness of the layer 12 is small, is optical intensity profile 13b having a diffuse profile is formed in the region of the device wherein the thickness of the layer 12 is large. Thus, the photons that are created in the active layer 13 are diffused to the guide layer 12 due to the reduced optical confinement factor $\Gamma$ and transported along the guide layer 12 to the output end without experiencing further stimulated emission. At the output end, an output optical beam Pout thus amplified and having a large output power is outputted.

Next, the process for fabricating the device of the first embodiment will be described with reference to FIGS.5(A)–5(E).

Figure 5A:
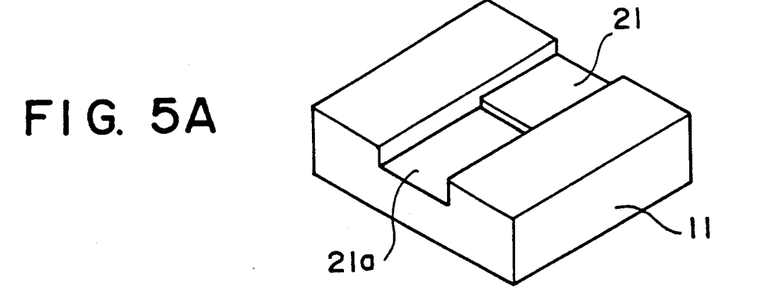
FIGS.5(A)–5(E) are diagrams showing the process for fabricating the device of FIG.4(A)

Referring to FIG.5(A), a groove 21 is formed in the upper major surface of the InP substrate 11 by a photolithographic patterning process to extend in the longitudinal direction of the laser diode. Further, a part of the groove 21 is protected by a patterned mask and a groove part 21a having an increased depth is formed in correspondence to the thick region of the waveguide layer 12 that is to be formed. Thus, the boundary between the groove 21 and the groove 21a in FIG.5(A) corresponds to the position X shown in FIG.4(B).

Figure 5B:
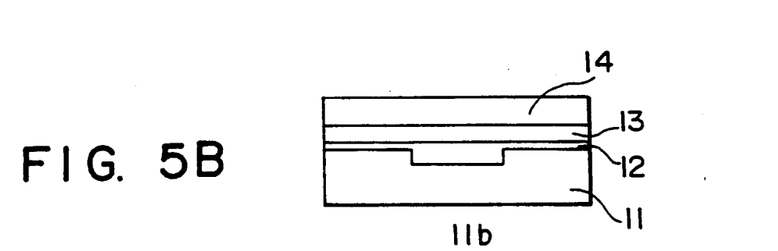

Next, in the step of FIG.5(B), the waveguide layer 12, the active layer 13 and the clad layer 14 are grown consecutively by the liquid phase epitaxy (LPE) process. Because of the LPE process, the waveguide layer 12 thus formed has a substantially flat upper major surface, and the layers 13 and 14 grown on the layer 12 also have substantially flat upper and lower major surfaces that extend parallel with each other.

Figure 5C:
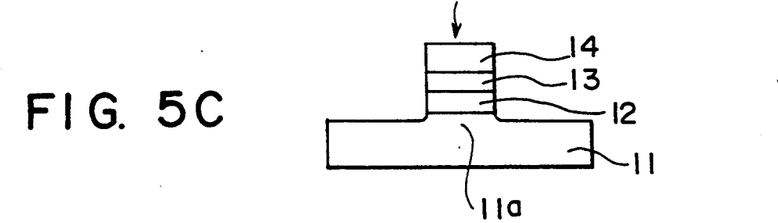
Figure 5D:
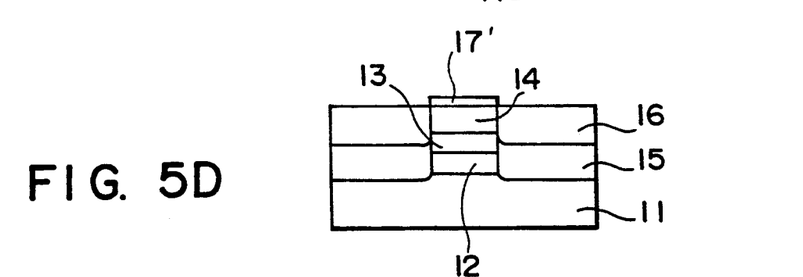

Further, in the step of FIG.5(C), the stripe-like region shown by a numeral 11b is formed by etching such that there is formed a mesa 11a in the substrate 11 and the etching reaches a level at least equal to or below the level of the upper major surface of the mesa 11a. After the region 11b is formed as such, the top surface of the layer 14 is protected by a silicon oxide film 17' and the p-type InP layer 15 is grown by the LPE or other suitable process until the upper major surface of the layer 15 is located between the upper and lower major surfaces of the active layer 13. After the layer 15 is grown, the n-type InP layer 16 is grown on the layer 15 by the LPE or other suitable process until the top surface of the layer 16 substantially coincides with the top surface of the layer 14. Thereby, a structure shown in FIG.5(D) is obtained.

Figure 5E:
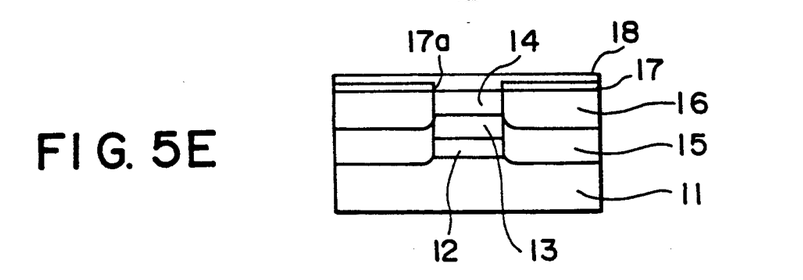

In the step of FIG.5(E), the silicon oxide protection film 17' is removed and the silicon oxide film 17 is provided uniformly on the upper major surface of the layer 16 including the upper major surface of the layer 14. Further, the opening 17a is formed in the silicon oxide film 17 to expose the upper major surface of the clad layer 14, and the upper electrode 18 is deposited on the silicon oxide film 17 in contact with the layer 14 via the opening 17a. Furthermore, the lower electrode 19 and the anti-reflection coatings 10a and 10b are provided, and the structure of FIG.4(A) is completed.

Figure 6A:
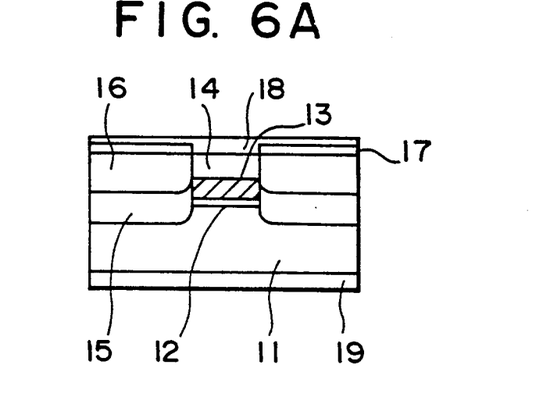
FIGS.6(A) and 6(B) are diagrams showing a second embodiment of the present invention.
Figure 6B:
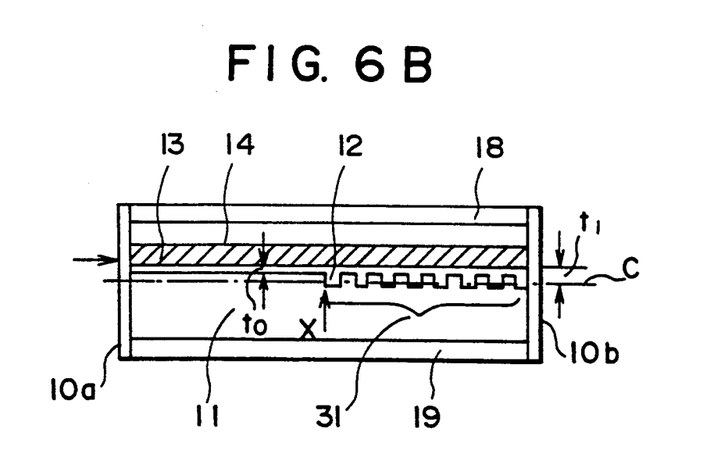

FIGS.6(A) and 6(B) are diagrams showing a second embodiment of the present invention wherein FIG.6(A) is an end view substantially identical with FIG.4(C).

In the present embodiment, there is formed a corrugation 31 in the lower major surface of the wave-guide layer 13 in correspondence to the region wherein the thickness of the layer 12 is increased in the first embodiment. More specifically, there is a central level C about which the corrugation swings up and down alternately, wherein the level C is set substantially below the level of the lower major surface of the layer 12 for the region where there is no corrugation. Further, the pitch of the corrugation is set such that there is no resonance with the optical beam that is amplified in the active layer 13.

By employing the structure of FIG.6(B), one can increase the effective thickness of the waveguide layer 12 and the effect similar to the first embodiment is achieved. The corrugation 31 can be formed by the known process used in the fabrication of DFB lasers.

Figure 7A:
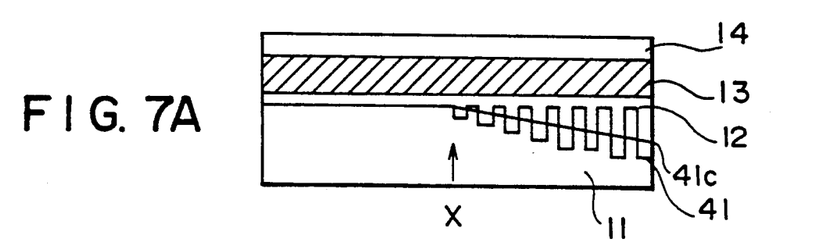
FIGS.7(A)–7(C) are diagrams showing the structure of the laser amplifier according to a third embodiment of the present invention.

FIG.7(A) shows a modification of the embodiment of FIG.6(A), wherein a corrugation 41 is formed in place of the corrugation 31 with the corrugation depth that increases continuously from the point X to the output end. In this case, the line represented as 41c and connecting the center of the corrugation 41, extends obliquely in the downward direction toward the output end and the effective thickness of the waveguide layer 12 increases continuously from the point X to the output end. Again the pitch of corrugation is set such that there is no resonance occurring between the optical beam and the corrugation 41. In one example, the depth of corrugation is increased from 0.4 μm at the point X to 300 μm at the output end. The pitch of corrugation may be set to 0.8 μm.

Figure 7B:
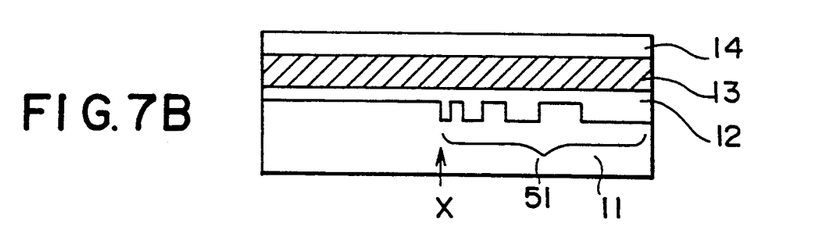

FIG.7(B) shows another modification of the embodiment of FIG.6(A), wherein a corrugation 51 is formed in place of the corrugation 31 with a pitch that increases from the point X to the output end. In the present embodiment, the depth of corrugation is held constant. In this embodiment, too, one can increase the effective thickness of the waveguide layer 12 in the region extending from the point X to the output end.

Figure 7C:
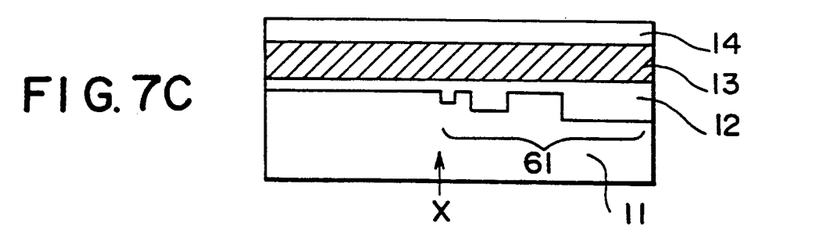

FIG.7(C) shows an embodiment that has the feature of both embodiments of FIGS.7(A) and 7(B) wherein a corrugation 61 is formed in place of the corrugation 31. In the corrugation 61, both the depth and the pitch are changed simultaneously to obtain the desired increase of the effective thickness of the waveguide layer 12. In the foregoing embodiments of FIGS.7(A)-7(C), it should be noted that the effective thickness of the waveguide layer 12 corresponds to the averaged thickness of the layer 12. Thus, the effective thickness of the layer 12 is represented by the line 41c for the embodiment of FIG.7(A). A similar increase in the effective thickness of the layer 12 is obtained in the embodiments of FIGS.7(B) and 7(C). It will be noted that the effective thickness of the layer 12 is set at the thickness $t_1$ shown in FIG.3.

It should be noted that the structures of FIGS.7(A)-7(C) are formed easily by the electron beam lithography. More particularly, the desired grating is formed by applying an electron beam resist on the surface of the mesa region 11a, writing a pattern of corrugation on the electron beam resist by the electron beam while changing the pitch or amount of exposure, developing the electron beam resist, and applying an etching process while using the patterned electron beam resist thus obtained. Alternatively, the grating that changes its pitch in the longitudinal direction of the resonator may be obtained by placing a glass plate that changes its thickness gradually on the upper major surface of the mesa 11a when exposing the pattern of the corrugation by the interference of two coherent optical beams.

Figure 8:
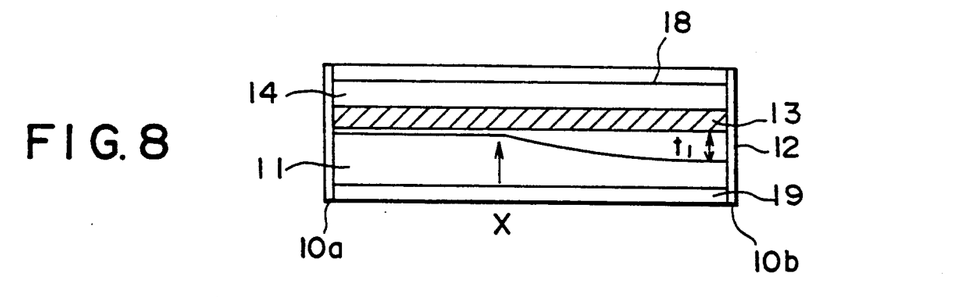
FIG.8 is a diagram showing the structure of the laser amplifier according to a fourth embodiment of the present invention.

FIGS.8 shows a third embodiment of the present invention. As illustrated, the waveguide layer 12 of the present invention has a thickness that increases gradually from the point X to the output end on which the anti-reflection coating 10b is provided. In this embodiment, too, the thickness of the layer at the output end is set to the thickness $t_1$ shown in FIG.3. Such a sloped surface of the layer 12 is obtained by applying an isotropic etching process in the process of FIG.5(A) for forming the groove 21a. Alternatively, an anisotropic etching process may be applied obliquely to the surface of the substrate 11 in the step of FIG.5(A).

Figure 9:
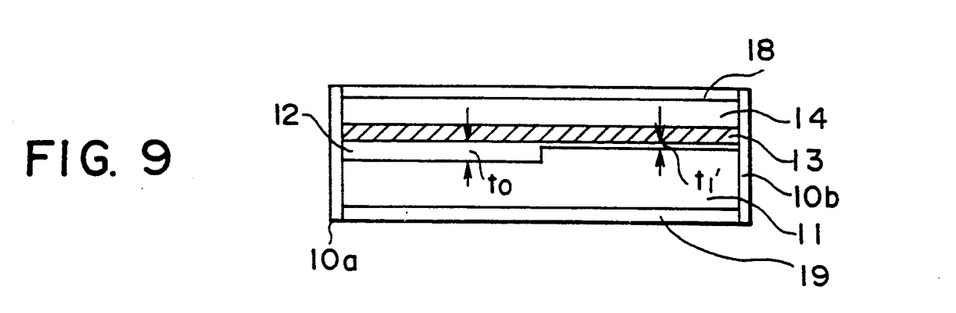
FIG.9 is a diagram showing the structure of the laser amplifier according to a fifth embodiment of the present invention.

FIG.9 shows a fourth embodiment of the present invention wherein the thickness of the guide layer 12 is set to the thickness $t_0$ at the input end and to the thickness $t_1'$ at the output end. See FIG.3. As can be seen in FIG.3, the thickness $t_1'$ is substantially smaller than the thickness $t_0$. In this case, too, the desired decrease in the optical confinement is achieved at the output end of the active layer 3. Thereby, the problem of unwanted saturation of the active layer 3 at the output end of the laser diode is avoided and an optical amplification of the traveling optical beam is achieved throughout the length of the laser amplifier.

It should be noted that the laser amplifier of the present invention is not limited to the embodiments described heretofore wherein the waveguide layer 12 is provided below the active layer 13. It will be obvious, form the principle described with reference to FIG.3, that the laser diode of the present invention operates similarly when the waveguide layer 12 is provided above the active layer 13.

Figure 10:
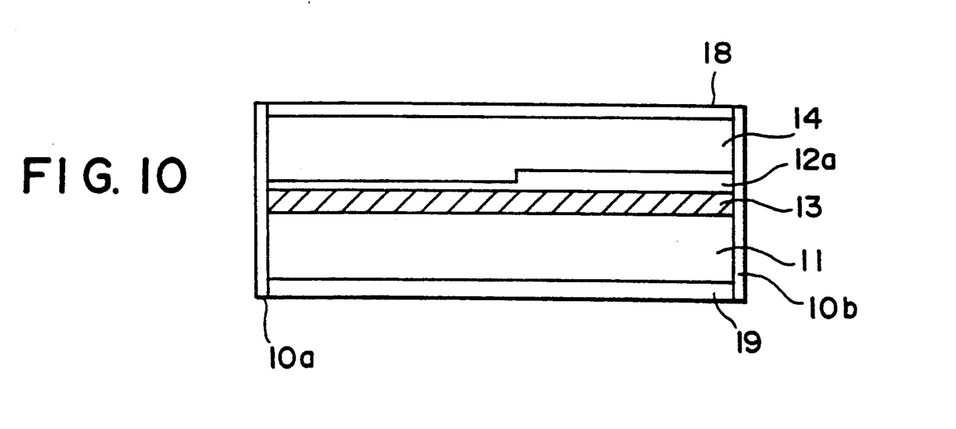
FIG.10 is a diagram showing the structure of the laser amplifier according to a sixth embodiment of the present invention.

FIG.10 shows such an example wherein a waveguide layer 12a is provided above the active layer 13. In correspondence to this, the waveguide layer 12 below the active layer 13 is eliminated. In the present case, the waveguide layer 12a is doped to the p-type rather than n-type.

Further, the present invention is not limited to the embodiments described heretofore, but various variations and modifications may be made without departing from the scope of the invention.

What is claimed is

1. A laser amplifier having an input end and an output end for amplifying an incident optical beam supplied to said input end and outputting an output optical beam from said output end after optical amplification, comprising:

an active layer having a first refractive index, said active layer extending in a first direction from said input end to said output end from which an output optical beam is exited, said active layer having a substantially flat upper major surface and a substantially flat lower major surface both extending in said first direction, said active layer having a uniform thickness such that said upper and lower major surfaces extend generally parallel with each other, said active layer further having a first side wall and a second, opposing side wall both extending in said first direction, said active layer having a uniform width such that said first and second side walls extend with a uniform separation from each other, said active layer forming said output optical beam by amplifying the incident optical beam that is caused by a stimulated emission of photons upon passage of the incident optical beam through the active layer in said first direction from said input end to said output end;

an optical wave guide layer of a semiconductor material doped to a first conductivity type and having a second refractive index, said optical waveguide layer having upper and lower major surfaces and extending in said first direction from said input end to said output end, said optical waveguide layer being provided such that said upper and lower major surfaces of said optical waveguide layer extend generally in parallel with said upper and lower major surfaces of the active layer and in contact with said active layer at either one of said upper major surface and said lower major surface of the active layer so that the optical beam amplified in the active layer is transferred to the optical waveguide layer and guided in the first direction therealong, said optical waveguide layer having a thickness, measured across said upper major surface and said lower major surface of the optical waveguide layer, such that said thickness is set at a first value at said input end and at a second, different value at said output end, said first and second values of said thickness being determined such that there is a large optical confinement in the active layer at said input end and there is a smaller optical confinement in the active layer at said output end;

a first clad layer of a semiconductor material doped to said first conductivity type and having a third refractive index that is smaller than said second refractive index, said first clad layer having upper and lower major surfaces and provided below said lower major surface of said waveguide layer;

a second clad layer of a semiconductor material having a fourth refractive index that is smaller than said first refractive index and doped to said second conductivity type that is opposite to said first conductivity type, said second clad layer having upper and lower major surfaces and provided above said upper major surface of said active layer;

first electrode means provided on said upper major surface of the second clad layer in ohmic contact therewith for injecting first carriers having a first polarity to said active layer through said second clad layer;

second electrode means provided on said lower major surface of the first clad layer in ohmic contact therewith for collecting second carriers having a second, opposite polarity to said active layer through said first clad layer;

first anti-reflection means provided on said input end for minimizing reflections at said input end; and second anti-reflection means provided on said output end for minimizing reflections at said output end.

2. A laser amplifier as claimed in claim 1 in which said first value of the thickness of the optical waveguide layer is determined such that the optical confinement in the active layer becomes maximum.

3. A laser amplifier as claimed in claim 1 in which said optical waveguide layer has a substantially flat upper major surface and is provided under the lower major surface of the active layer such that the upper major surface of the optical waveguide layer contacts with the lower major surface of the active layer intimately.

4. A laser amplifier as claimed in claim 3 in which said lower major surface of the optical waveguide layer is formed with a stepped region such that the thickness of the optical waveguide layer changes stepwise across the stepped region, the thickness of said waveguide layer being set to said first value for a region that is located closer to the input end with respect to the stepped region, the thickness of said waveguide layer being set to said second value for a region that is located closer to the output end with respect to the stepped region.

5. A laser amplifier as claimed in claim 3 in which said first value is set smaller than said second value.

6. A laser amplifier as claimed in claim 3 in which said first value is set larger than said second value.

7. A laser amplifier as claimed in claim 1 in which said optical waveguide layer has a substantially flat lower major surface and is provided above the upper major surface of the active layer such that the lower major surface of the optical waveguide layer contacts with the upper major surface of the active layer intimately.

8. A laser amplifier as claimed in claim 7 in which said upper major surface of the optical waveguide layer is formed with a stepped region such that the thickness of the optical waveguide layer changes stepwise across the stepped region, the thickness of said waveguide layer being set to said first value for a region that is located closer to the input end with respect to the stepped region, the thickness of said waveguide layer being set to said second value for a region that is located closer to the output end with respect to the stepped region.

9. A laser amplifier as claimed in claim 1 in which said optical waveguide layer includes a first region extending from said input end toward said output end and having a thickness that is held constant at said first value and a second region extending from said output end toward said input end, said first region and said second region being connected with each other at a boundary position, said second region being formed with a corrugation.

10. A laser amplifier as claimed in claim 9 in which said corrugation has an amplitude that increases from said boundary position to said output end.

11. A laser amplifier as claimed in claim 9 in which said corrugation has a pitch that increases from said boundary position to said output end.

12. A laser amplifier as claimed in claim 1 in which said optical waveguide layer includes a first region extending from said input end toward said output end and having a thickness that is held constant at said first value and a second region extending from said output end toward said input end, said first region and said second region being connected with each other at a boundary position, said second region having a thickness increasing from said boundary position to said output end continuously.

* * * * *

UNITED STATES PATENT AND TRADEMARK OFFICE
CERTIFICATE OF CORRECTION

PATENT NO. : 5,200,968
DATED : April 6, 1993
INVENTOR(S) : Hirohide KURAKAKE et al.

It is certified that error appears in the above-indentified patent and that said Letters Patent is hereby corrected as shown below:

Col. 1, line 14, change "BY" to --By--.

Col. 6, line 19, after "is" (second occurrence) insert --represented as a profile 12a. On the other hand, an--.

Signed and Sealed this

Twenty-first Day of June, 1994

Attest:

BRUCE LEHMAN

Attesting Officer     Commissioner of Patents and Trademarks